United States Patent [19]

Smith

[11] 4,289,982
[45] Sep. 15, 1981

[54] APPARATUS FOR PROGRAMMING A DYNAMIC EPROM

[75] Inventor: Stephen L. Smith, Tempe, Ariz.

[73] Assignee: Motorola, Inc., Schaumburg, Ill.

[21] Appl. No.: 53,148

[22] Filed: Jun. 28, 1979

[51] Int. Cl.³ .............. H03K 19/173; H03K 19/096; G11C 7/00; G11C 11/40
[52] U.S. Cl. .................................. 307/463; 307/468; 365/95; 365/104; 365/230
[58] Field of Search ......... 307/205, 238, 270, DIG. 5; 365/94, 95, 103, 104, 230, 231

[56] References Cited

U.S. PATENT DOCUMENTS 4,094,012  6/1978  Perlegos et al. ................ 365/230 X
4,110,842  8/1978  Sarkissian et al. ....... 307/DIG. 5 X

FOREIGN PATENT DOCUMENTS 2417972  10/1975  Fed. Rep. of Germany ... 307/DIG. 5 X Primary Examiner—Larry N. Anagnos
Attorney, Agent, or Firm—Vincent B. Ingrassia

[57] ABSTRACT

An insulated-gate field-effect-transistor (IGFET) quasi-static decoder for programming an electronically-programmable read-only memory (EPROM) applies to the floating gate of selected memory devices a programming voltage. Prior to selection, each row and column conductor of the memory is latched at a first voltage. Precharge circuitry responsive to a single precharge pulse establishes an enabling voltage for unlatching a selected row and column. The selected row and column is then coupled via a switch to a source of programming voltage.

12 Claims, 6 Drawing Figures

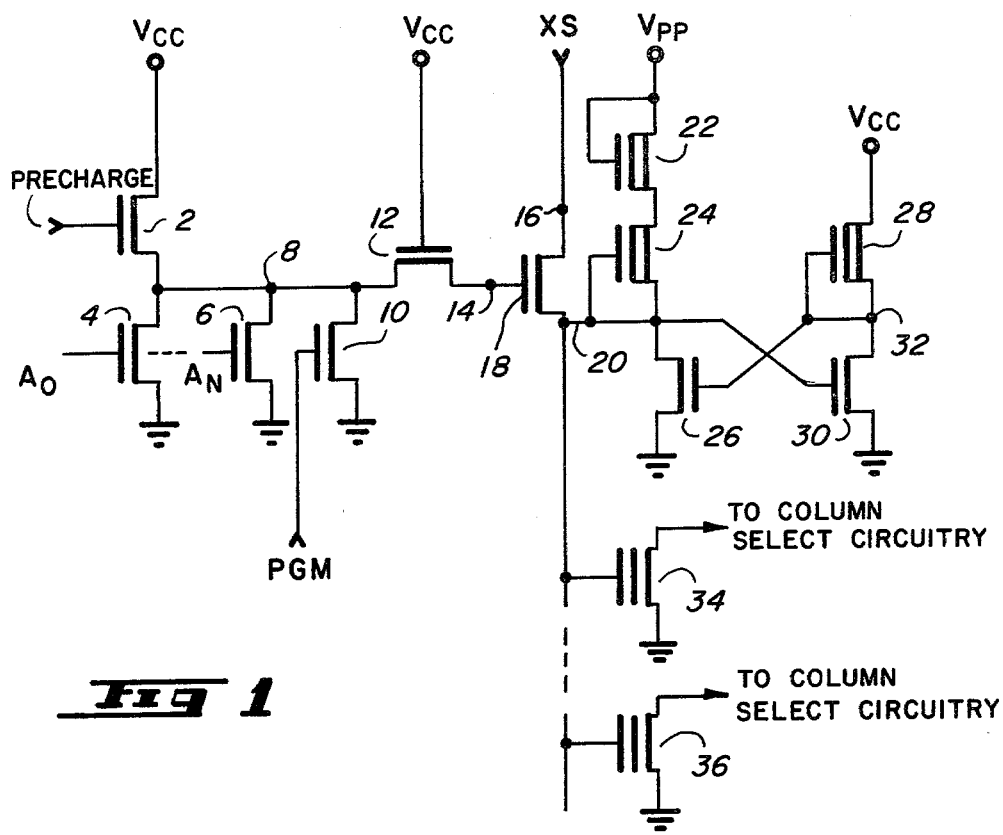
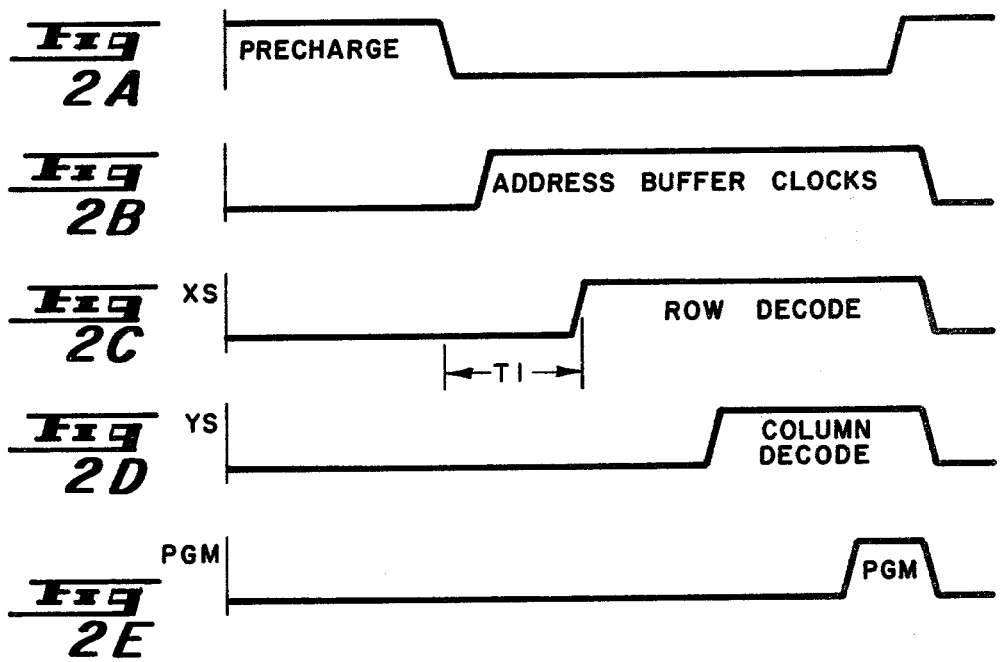

4,289,982

APPARATUS FOR PROGRAMMING A DYNAMIC EPROM

BACKGROUND OF THE INVENTION

1. Field of the Invention

This invention relates generally to semiconductor memory circuits and, more particularly, to an insulated gate field effect transistor (IGFET) quasi-static decoder for programming a dynamic electrically programmable read only memory (EPROM).

2. Description of the Prior Art

Some read only memories may be programmed by causing a permanent and irreversible change in the memory mental interconnection pattern by applying electrical pulses thereto. Other ROMs have been programmed by causing a reversible change in the characteristic of a memory device within the ROM. These so-called alterable ROMs are generally deprogrammed by exposing the device to ultraviolet light. Both static and dynamic decoders have been employed to accomplish this reversible programming; however, each suffer from certain disadvantages.

In the case of a static decoder, the decoder circuitry is configured so as to draw current all the time. With the ever increasing demands for larger and larger memory arrays, the power requirements become very high. Furthermore, static decoders perform at relatively low speeds when compared to dynamic decoders.

While dynamic decoders require less power and perform at higher speeds, they are susceptible to leakage at the precharged nodes. Since it may take as much as 50 milliseconds to program a memory cell, periodic program pulsing is required to overcome the leakage problem. Furthermore, those EPROMs which are ultra-violet erasable are generally equiped with a clear lid. This permits optical infiltration which causes the nodes to discharge even faster.

SUMMARY OF THE INVENTION

It is an object of the present invention to provide a circuit for programming an EPROM cell with one low level pulse, said circuit consuming less current than a static decoder.

It is a further object of the invention to provide a circuit for programming an EPROM memory cell with low level signals, which circuit also operates at high speed and consumes less power.

Finally, it is an object of the present invention to provide a circuit for programming an EPROM cell which combines the feature of low level single pulse programming, low power consumption and high speed, which circuit can be implemented with MOS insulated gate field effect transistors.

According to a broad aspect of the invention there is provided a circuit for providing a programming signal from a first source of supply voltage to row or column conductors of an electrically programmable read-only memory, comprising: first means associated with each of said conductors for latching each of said conductors at a voltage below that of said first source; second means associated with each of said conductors for establishing an enabling voltage with a single precharge pulse; first switching means coupled to said enabling voltage and responsive thereto for unlatching a selected one of said conductors; and third means associated with each of said conductors for coupling said first source to said selected one of said conductors.

The above and other objects, features and advantages of the invention will be more clearly understood from the Following detailed description taken in conjunction with the accompanying drawings in which:

BRIEF DESCRIPTION OF THE DRAWINGS

FIG. 1 is a schematic diagram of the inventive EPROM memory cell program circuit; and FIG. 2 (A-E) is a timing diagram which demonstrates the operation of the circuit shown in FIG. 1.

DESCRIPTION OF THE PREFERRED EMBODIMENT

Referring to FIG. 1, there is shown a precharge device 2 coupled between a source of supply voltage $V_{CC}$ and the common drain of a plurality of word-line decode devices only two of which, 4 and 6, are shown. It is to be understood, however, that the number of word-line decode devices would correspond to the number of address bits, Ao-An, necessary to access the total number of rows in the memory. A program device 10 is coupled between node 8 and ground and has a gate electrode which receives a program enable signal (PGM) as will be discussed below.

Device 12 has a current conducting path coupled in series between nodes 8 and 14 and has a gate coupled to $V_{CC}$. This device serves to isolate that portion of the circuit discussed thus far from the remaining portion of the circuit. Device 18, a word select device, has a gate coupled to node 14 and a first of its current conducting electrodes coupled to a row select signal (XS). The other current conducting electrode of device 18 is coupled in common with row select line 20 and the control gates of a plurality of memory devices only two of which, 34 and 36, are shown. It will be understood, however, that any desired number of memory bits may be coupled to one particular row line.

A latching device is also coupled to row select line 20. This latching device comprises enhancement devices 26 and 30 and depletion device 28. Device 26 has its current conducting path coupled between row select line 20 and ground, and has a gate electrode coupled to node 32. Device 30 has a current conducting path coupled between node 32 and ground, and has a gate coupled to the row select line 20. Finally, depletion device 28 has a current conducting path coupled between a source of supply $V_{CC}$ and node 32 and has a gate electrode coupled to its source electrode and to the gate electrode of device 26.

Word line pull-up devices, 22 and 24, are coupled in series between a second source of supply voltage $V_{pp}$ (typically 25 volts) and row select line 20. Device 22 has its gate coupled to its drain electrode and serves as a voltage limiter. The gate of device 24 is likewise coupled to the row select line 20.

The operation of the inventive programming circuit will now be described. During the precharge period shown in FIG. 2A, device 2 is turned on causing node 8 to achieve a voltage equivalent to one enhancement threshold below the supply voltage $V_{CC}$. Since $V_{CC}$ is applied to the gate of device 12, node 14 is also charged to the voltage at node 8. Also during the precharge period, node 16 is at ground, the row select line 20 is at ground and node 32 is charged to $V_{CC}$. Additionally, XS, PGM and all address lines are grounded during the precharge period.

After precharge, the address buffer clocks are activated (FIG. 2B) and the address bits Ao-An are applied to word line select devices 4, 6, etc. Of all of the rows in memory, the address select devices of only the addressed row will have all zero inputs (negative logic). Thus, if row 20 is the desired row, zeros will appear at the gates of select devices 4, 6, etc. Therefore, these devices will not turn on and nodes 8 and 14 will remain charged to its precharge level. However, at least one address select device for each of the other rows in the memory will have a "1" applied to its gate thus discharging nodes 8 and 14 in each of the other rows.

After a sufficient amount of time ($t_1$) has elapsed in order to perform the decoding function, the row decode clock XS becomes high as is shown in FIG. 2C. The overlap capacitance of device 18 causes node 14 to be bootstrapped to a voltage which is above the supply voltage $V_{CC}$ (typically 7 or 8 volts). This turns device 18 on pulling word line 20 up to XS (approximately 5 volts). For all other rows, node 14 has been discharged and therefore, device 18 does not turn on.

During the precharge period, line 20 was at ground, node 32 was at 5 volts, device 26 having a gate coupled to node 32 was on and device 30 having a gate coupled to row line 20 was off. When the voltage on row line 20 rises to XS, device 30 turns on discharging node 32 and turning device 26 off. Thus, row line 20 is no longer held down by device 26. As long as XS is high, line 20 is held at 5 volts.

Shortly after the row decode has been accomplished, a similar operation occurs to select a desired column. As can be seen in FIG. 1, each of the devices having control gates coupled row select line 20 has a drain coupled to similar column select circuitry. This column select function is initiated by a column select signal YS shown in FIG. 2D.

When the programming signal (PGM) shown in FIG. 2E goes high, (5 volts) device 10 turns on discharging node 14. At this point, the row select line 20 pulls up to $V_{pp}$ (25 volts) through the action of the depletion devices 22 and 24. As a result, 25 volts is applied to the control gates of all of the memory devices coupled to that row. Similarly, 25 volts is applied to the gate of the column select device coupling the high program voltage (25 volts minus one enhancement threshold) to the drain of device 34. With 25 volts on the control gate of device 34 and the high voltage on the drain of device 34 as a result of that column being selected, charge is injected onto the floating gate of device 34 thus programming device 34. It should be clear that all, none or some of devices coupled to row line 20 may be simultaneously programmed by enabling the appropriate column select lines.

The foregoing description of a preferred embodiment of the invention is given by way of example only. Changes in form and detail may be one skilled in the art without departing from the spirit and scope of the invention as defined by the appended claims.

I claim:

1. A circuit for providing a programming signal from a first source of supply voltage to row or column conductors of an electronically programmable read-only-memory, comprising:
   first means associated with each of said conductors for latching each of said conductors at a voltage below that of said first source;
   second means associated with each of said conductors for establishing an enabling voltage with a single precharge pulse;
   first switching means coupled to said enabling voltage and responsive thereto for unlatching a selected one of said conductors; and
   third means associated with each of said conductors for coupling said first source to said selected one of said conductors.

2. A circuit according to claim 1 wherein said second means comprises:
   second switching means coupled between said first switching means and a second source of supply voltage for generating said enabling voltage; and
   first discharge means coupled between said first and second switching means for discharging said enabling voltage on all but said selected one of said conductors.

3. A circuit according to claim 2 where said third means comprises third switching means coupled between each of said conductors and said first source of supply voltage.

4. A circuit according to claim 3 further comprising voltage limiting means coupled between said first source of supply voltage and said third switching means.

5. A circuit according to claim 4 wherein said current limiting means comprises an insulated-gate field effect transistor of the depletion type having drain and gate electrodes coupled to said first source of supply voltage and having a source electrode coupled to said third switching means.

6. A circuit according to claim 4 further comprising fourth switching means coupled between said first and second switching means for discharging said enabling voltage on said selected one of said conductors after said selected one of said conductors has been unlatched.

7. A circuit according to claim 6 further comprising fifth switching means coupled between said first and fourth switching means for isolating said first switching means from said second switching means and said first discharge means.

8. A circuit according to claim 7 wherein said circuit receives PRECHARGE, PROGRAM and SELECT control signals and wherein said first switching means comprises a first field effect transistor having a gate coupled to said enabling voltage, a drain coupled to said SELECT signal and a source coupled to one of said conductors.

9. A circuit according to claim 8 wherein said second switching means comprises a second field effect transistor having a gate coupled to said PRECHARGE signal, a drain coupled to said second source of supply and a source coupled to the gate of said first field effect transistor.

10. A circuit according to claim 9 wherein said fourth switching means is a fourth field effect transistor having a drain coupled to the source of said second field effect transistor, a source coupled to ground and a gate coupled to said PROGRAM signal.

11. A circuit according to claim 10 wherein said third switching means comprises a third field effect transistor of the depletion type having source and gate electrodes coupled to said one of said conductors and having a drain electrode coupled to said voltage limiting means.

12. A circuit according to claim 11 wherein said first means comprises:

a fifth insulated gate field effect transistor having source, drain and gate electrodes, said drain electrode coupled to said one of said conductors and said source coupled to ground;

a sixth field effect transistor having source, drain and gate electrodes, said gate electrode coupled to said one of said conductors and said source electrode coupled to ground; and a seventh field effect transistor of the depletion type having a gate electrode coupled to its source electrode, to the gate electrode of said fifth transistor and to the drain electrode of said sixth transistor having a drain coupled to said second source of supply.

* * * * *